(12) United States Patent
Han et al.

(10) Patent No.: US 7,156,538 B2
(45) Date of Patent: Jan. 2, 2007

(54) LED PACKAGE FOR BACKLIGHT UNIT

(75) Inventors: Kyung Taeg Han, Kyungki-do (KR); Chan Wang Park, Kyungki-do (KR); Seon Goo Lee, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 113 days.

(21) Appl. No.: 10/953,787

(22) Filed: Sep. 30, 2004

(65) Prior Publication Data

US 2006/0023451 A1    Feb. 2, 2006

(30) Foreign Application Priority Data

Jul. 28, 2004    (KR) .................. 10-2004-0059324

(51) Int. Cl.
*F21V 21/00*    (2006.01)
(52) U.S. Cl. .................. 362/249; 362/267; 362/310; 257/330; 373/36
(58) Field of Classification Search ............... 257/330; 373/36; 362/249

See application file for complete search history.

(56) References Cited

U.S. PATENT DOCUMENTS

| | | | |
|---|---|---|---|
| 6,523,976 B1 * | 2/2003 | Turnbull et al. | ............ 362/231 |
| 6,747,293 B1 | 6/2004 | Nitta et al. | |
| 6,812,481 B1 | 11/2004 | Matsumura et al. | |
| 2004/0208210 A1 * | 10/2004 | Inoguchi | ...................... 372/36 |
| 2004/0240203 A1 * | 12/2004 | Matsumura et al. | ........ 362/227 |

FOREIGN PATENT DOCUMENTS

JP    2001-36154    2/2001

\* cited by examiner

*Primary Examiner*—Renee Luebke
*Assistant Examiner*—Mary Zettl
(74) *Attorney, Agent, or Firm*—Lowe Hauptman & Berner, LLP.

(57)    ABSTRACT

Disclosed herein is an LED package for a backlight unit. The LED package includes a plurality of LEDs, a die bonding part, a wire bonding part and a body. The die bonding part, on which the plurality of LEDs is arranged, allows the first electrodes of the LEDs to be electrically connected to an external circuit. The wire bonding part is spaced apart from the die bonding part by a predetermined distance to be insulated from the die bonding part and allows the second electrodes of the LEDs to be electrically connected to the external circuit so that the LEDs are operated. The body has a molding cup which is used to fill a space above the LEDs with transparent resin and a base on which the die bonding part and the wire bonding part are arranged.

5 Claims, 7 Drawing Sheets

LED PACKAGE FOR BACKLIGHT UNIT

RELATED APPLICATION

The present application is based on, and claims priority from, Korean Application Number 2004-0059324, filed Jul. 28, 2004, the disclosure of which is hereby incorporated by reference herein in its entirety.

BACKGROUND OF THE INVENTION

1. Field of the Invention

The present invention relates generally to a backlight unit that is used as the light emitting source of a display device, such as a liquid crystal display, and, more particularly, to a backlight unit that uses light emitting diodes as a light emitting source.

2. Description of the Related Art

With the development of the electronic device industry, not only a variety of small-sized and low-energy-consumption display devices but also imaging apparatuses, computers and mobile communication terminals using the display devices are being developed. Liquid Crystal Displays (LCDs), which were developed to meet such a trend, are being popularized as display devices for monitors and mobile communication terminals.

Such an LCD is generally provided with a backlight unit, which is composed of a light source for generating light at the back or side of an LCD panel and a light guide plate, because the LCD cannot intrinsically generate light. In this case, the backlight unit enables the colors of images, which are realized by the LCD panel, to be accurately reproduced by generating white color light.

In the conventional backlight unit of the LCD, a Cold Cathode. Fluorescent Lamp (CCFL) or External Electrode Fluorescent Lamp (EEFL) has been employed as a light source. However, the conventional light sources, such as the CCFL and the EEFL, have the following disadvantages. That is, most of the CCFLs and EEFLs employ the plasma principle, so that the life spans thereof are shortened because there is variation in the pressure of plasma gas, and an inverter is required to obtain an operating voltage of up to several hundred volts that is necessary for the discharge of plasma. Meanwhile, in the case where such a backlight unit is applied to portable products, such as a mobile communication terminal, most of the power is consumed by the backlight unit. The CCFL and the EEFL are disadvantageous in that they have poor power consumption efficiencies and, therefore, consume excessive power.

In order to overcome the above-described disadvantages, a backlight unit using Light Emitting Diodes (LEDs) was proposed. An LED is a luminous device that generates light using a luminescence phenomenon (referred to as "electroluminescence") that occurs when voltage is applied to a semiconductor. Materials, which satisfy the conditions that light emission wavelengths exist in a visual or near infrared light region, light emission efficiencies are high and the formation of a p-n junction can be achieved, are suitable materials for the LED. Such materials include compounds, such as gallium nitride GaN, gallium arsenide GaAs, gallium phosphide GaP, gallium-arsenic-phosphorous GaAs1-xPx, gallium-aluminum-phosphorous Ga1-xAlxAs, indium phosphide InP, and indium-gallium-phosphorous In1-xGaxP.

Light emission may be classified into that generated by the recombination of free carriers and that generated by recombination at the luminous center of impurities. In this case, the wavelength of light generated by the recombination at the luminous center of impurities varies with the kind of impurities that are added to a semiconductor. For example, in the case of gallium phosphide, the light emission in which zinc and oxide atoms are involved is red (wavelength: 700 nm), and the light emission in which nitrogen atoms are involved is green (wavelength: 500 nm). That is, light generated by the LED has a specific characteristic color (wavelength) according to the kind of impurities and the material of a semiconductor. The LED is advantageous in that it has a small size and a long life span, and has high energy efficiency and can be operated at a low operating voltage because electrical energy is directly converted into light energy, compared to the conventional light sources. Accordingly, the LED having such advantages is being widely used as the light source of a backlight unit for an LCD.

FIG. 1 is a diagram showing the structure of a conventional LED package for a backlight unit.

Referring to FIG. 1, the conventional LED package 10 for a backlight unit includes a body 11 provided with a central cavity, two electrode plates 12 and 13 formed in the central cavity, and an LED chip 14.

The cavity is formed in the body 11 to allow the LED chip 14 to be mounted therein, and is filled with transparent resin. The sidewall of the cavity may be formed to be inclined at a predetermined angle and, therefore, guide light.

The electrode plates 12 and 13 are thin plates that are formed in the cavity with the first ends thereof being exposed to the cavity and the second ends thereof being implanted into the body 11.

The LED chip 14 may be mounted on one of the electrode plates 12 and 13. In this case, the anode and cathode terminals of the LED chip 14 are connected to the electrode plates 12 and 13, respectively, and further connected to an external circuit through the electrode plates 12 and 13, so that the LED chip 14 can be operated. For example, as shown in FIG. 1, the LED chip 14 is mounted on the first electrode plate 12, and the anode and cathode terminals of the LED chip 14 are wire-bonded to the first electrode plate 12 and the second electrode plate 13, respectively, thus being connected to the external circuit.

FIG. 2 is a diagram showing a structure in which the conventional LED package for a backlight unit is applied to an LCD, and the effects of the structure.

FIG. 2 illustrates the case where a plurality of LED packages 10 is arranged on one side of an LCD 20 as an example. Referring to FIG. 2, a conventional LED package 10 for a backlight unit has a structure in which a cavity is formed in a body 10 and an LED chip 14 is mounted in the cavity. Accordingly, in the case where the LED packages 10 are arranged on one side of the LCD 20, light is directly incident on the ranges 21 of the LCD 20 defined by the extension lines of the inclined sidewalls of the cavities of the LED packages 10 so that the ranges 21 become bright. In contrast, shadows are formed on the ranges on which light is not directly incident. As a result, the case where the conventional LED packages 10 are used as a backlight is disadvantageous in that light is nonuniformly incident on the LCD 20, so that a stain phenomenon occurs on the LCD 20, thus degrading image quality.

SUMMARY OF THE INVENTION

Accordingly, the present invention has been made keeping in mind the above problems occurring in the prior art, and an object of the present invention is to provide an LED package for a backlight unit, which is capable of maintaining high image quality as well as increasing luminous efficiency using LEDs in a display device, such as an LCD.

Another object of the present invention is to provide an LED package for a backlight unit, which has an optimal arrangement structure so as to allow the LED package not only to use many LEDs but also to have a thin and long shape.

Another object of the present invention is to provide an LED package for a backlight unit, which is capable of preventing physical deformation or breakage due to an external impact or the like in the case where the casing of the LED package is formed of a thin and long injection-molded body.

In order to accomplish the above object, the present invention provides an LED package for a backlight unit, including a plurality of LEDs; a die bonding part on which the plurality of LEDs is arranged, and which allows the first electrodes of the LEDs to be electrically connected to an external circuit; a wire bonding part which is spaced apart from the die bonding part by a predetermined distance to be insulated from the die bonding part, and which allows the second electrodes of the LEDs to be electrically connected to the external circuit so that the LEDs are operated; and a body having a molding cup which is used to fill a space above the LEDs with transparent resin and a base on which the die bonding part and the wire bonding part are arranged.

Preferably, the plurality of LEDs may be aligned along a same line.

Preferably, the LEDs may be mounted on silicon substrates, each of which has first and second electrode terminals formed on a top thereof, to form a plurality of LED chips, respectively; and the plurality of LED chips may be arranged in series in such a way that opposite polar electrode terminals of the LED chips are connected to each other by wires, the first electrode terminal of the LED chips is connected to the die bonding part, and the second electrode terminal of the LED chips is connected to the wire bonding part.

Preferably, the LEDs may be mounted on silicon substrates, each of which has a first electrode terminal formed on a top thereof, and second electrode terminals formed on the top and a bottom thereof, respectively, and connected to each other through a via, to form a plurality of LED chips, respectively; and the plurality of LED chips may be arranged in parallel in such a way that the first electrode terminals of the LED chips are connected to the wire bonding part by wires and the second electrode terminals formed on the bottom of the LED chips are attached to the die bonding part by conductive bonding material.

Preferably, the molding cup and the base may be formed as a single body.

Preferably, the LED package for a backlight unit may further include at least one support that is formed to traverse the length of the LED package and prevents the deformation of the LED package.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
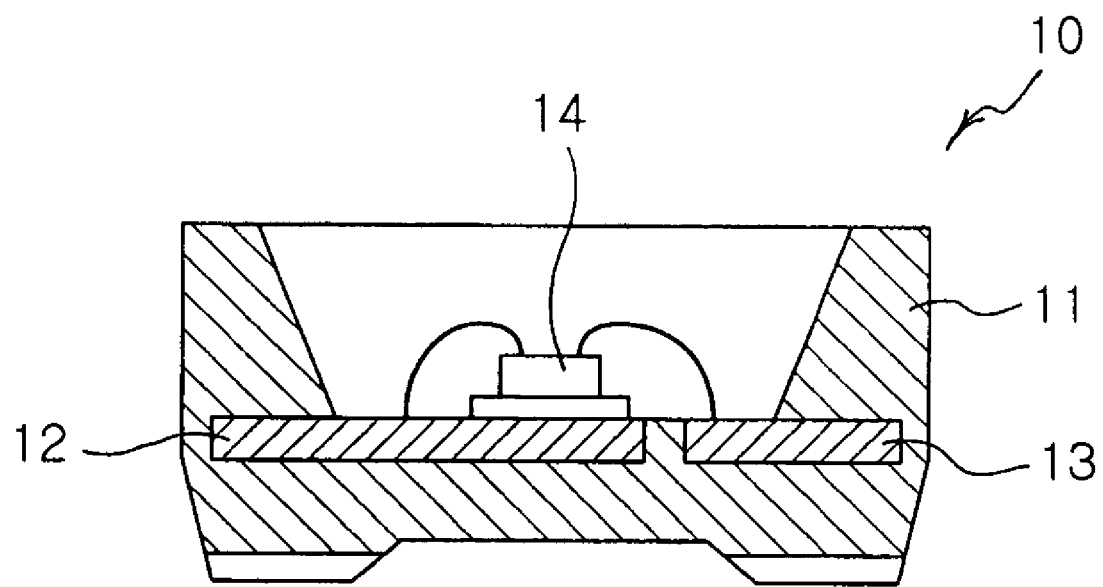
FIG. 1 is a diagram showing the structure of a conventional LED package for a backlight unit.

Reference now should be made to the drawings, in which the same reference numerals are used throughout the different drawings to designate the same or similar components.

Figure 3:
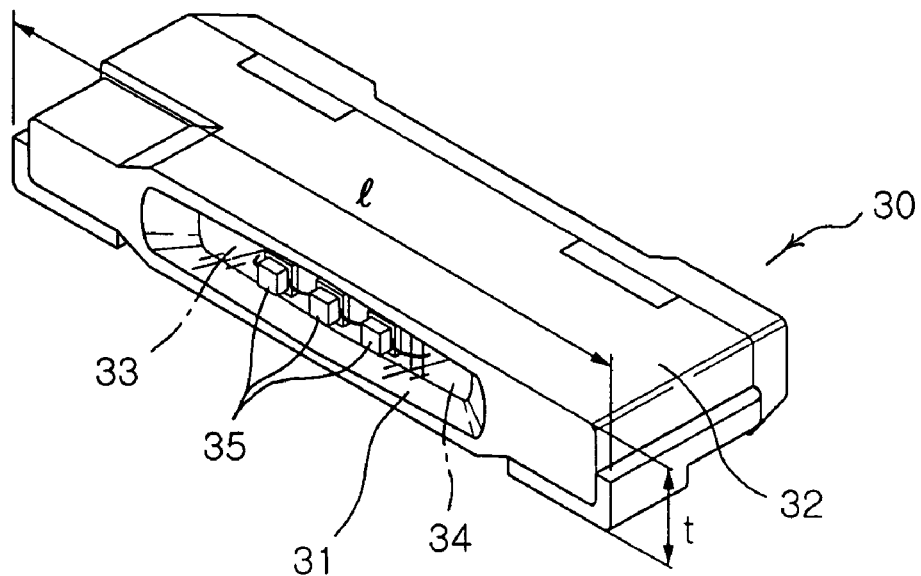
FIG. 3 is a perspective view of an LED package for a backlight unit in accordance with an embodiment of the present invention.

FIG. 3 is a perspective view of an LED package for a backlight unit in accordance with an embodiment of the present invention.

Referring to FIG. 3, the LED package 10 for a backlight unit according to an embodiment of the present invention includes a body 32 provided with a cavity 31, two electrode plates 33 and 34 formed in the cavity 31, and a plurality of LED chips 35. In this case, the two electrode plates 33 and 34 may be classified into a die bonding part 33 and a wire bonding part 34.

The LED package 30 may be used on, for example, one side of an LCD mounted in a portable terminal. Accordingly, the LED package 10 is thin in thickness t, and is considerably long in length l, compared to the thickness t, to correspond to the length of the LCD of the portable table.

The plurality of LED chips 35 is aligned along the same line on one electrode plate 33, so that the LED package 30 can include many LED chips 35 even though the LED package 30 has a small thickness t.

Figure 4:
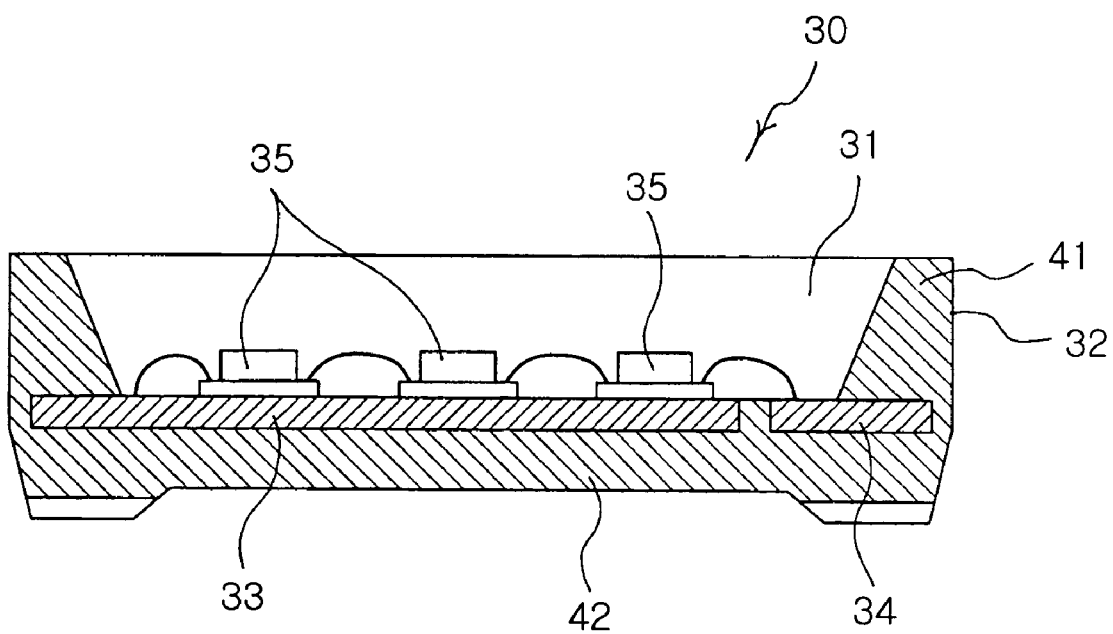
FIG. 4 is a sectional view of the LED package for a backlight unit in accordance with the embodiment of the present invention.

FIG. 4 is a sectional view of the LED package for a backlight unit in accordance with the embodiment of the present invention.

Referring to FIG. 4, the LED package 30 includes the plurality of LEDs 35, the die bonding part 33 on which the plurality of LEDs 35 is mounted, the wire bonding part 34, and the body 32.

The plurality of LEDs 35 is aligned along the same line on the die bonding part 33, and connected to an external circuit (not shown) through the die bonding part 33 and the wire bonding part 34, thus being operated.

The body 32 includes a molding cup 41 that is used to cover the plurality of LEDs 35 with resin, and a base 42 on which the die bonding part 33 and the wire bonding part 34 are arranged. The molding cup 41 and the base 42 may be formed as a single body. Alternatively, if the molding cup 41 and the base 42 are joined to each other after being separately formed, such a scheme is consistent with the present invention. Preferably, the molding cup 41 is provided with the cavity 31 therein, and the sidewall of the cavity 31 is inclined at a predetermined angle and, therefore, forms a reflecting surface capable of guiding light. The interior of the cavity is filled with transparent epoxy resin and phosphor, so that the LED package can form white color light.

The die bonding part 33 and the wire bonding part 34 are formed in the shape of thin plates, and placed on the base 42. The molding cup 41 is formed above the die and wire bonding plats 33 and 34. The die and wire bonding parts 33 and 34 are spaced apart from each other by a predetermined distance with an insulating part interposed therebetween, so that the die and wire bonding parts 33 and 34 can form separate electrodes, respectively. The construction of the electrodes will be described in detail later.

The plurality of LEDs 35 may be mounted on the die bonding part 33. In this case, each of the anode and cathode terminals of the LEDs 35 is connected to one of the die and wire bonding parts 33 and 34, and connected to the external circuit (not shown) through one of the die and wire bonding parts 33 and 34, so that the LEDs 35 can be operated. For example, as shown in FIG. 4, the LEDs 35 are mounted on the die bonding part 33, the anode terminal of the leftmost of the LEDs 35 is connected to the die bonding part 33 by a wire, and the cathode terminal of the rightmost of the LEDs 35 is connected to the wire bonding part 34 by a wire, so that the LEDs 35 can be connected to the external circuit through the die and wire bonding parts 33 and 34.

Figure 5A:
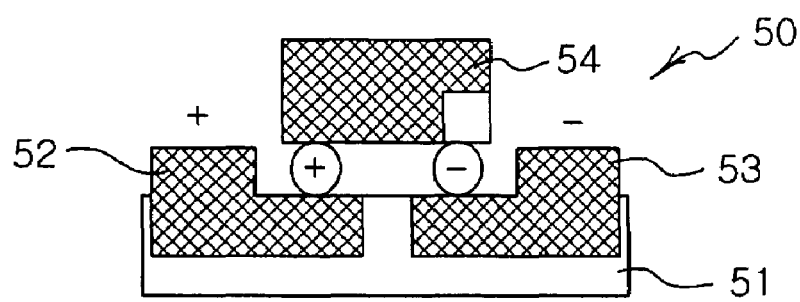
FIGS. 5a and 5b are diagrams showing an LED package in which a plurality of LEDs is arranged in series in accordance with another embodiment of the present invention.
Figure 5A:
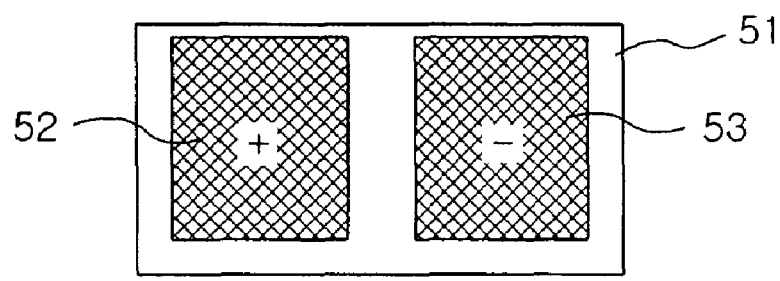
Figure 5B:
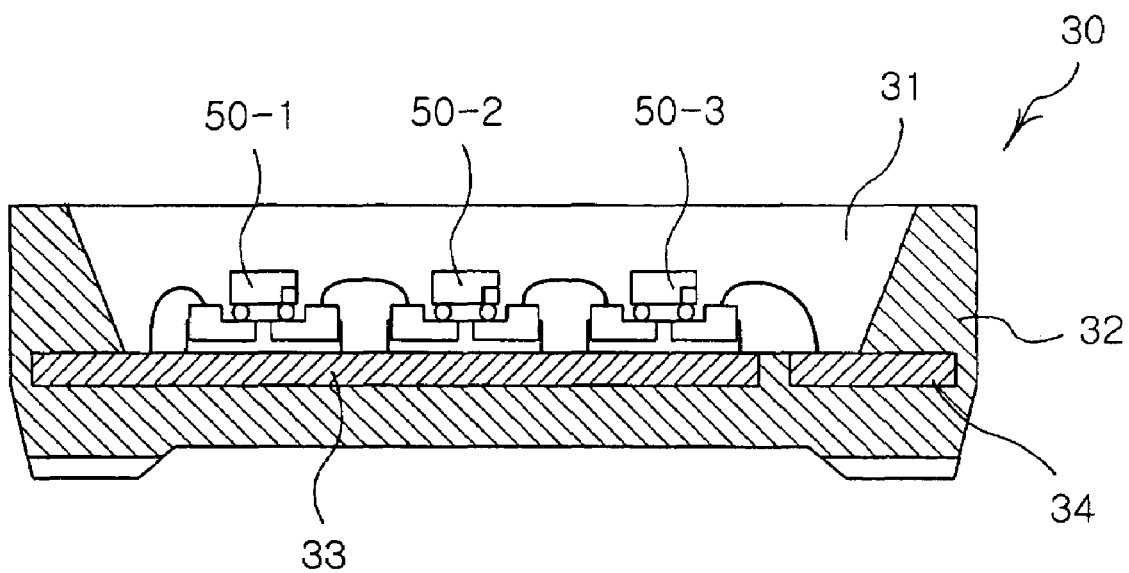

FIGS. 5a and 5b are diagrams showing an LED package in which a plurality of LEDs is arranged in series in accordance with another embodiment of the present invention.

Referring to FIG. 5a, an LED, which is included in an LED package 30 according to the present invention, may be fabricated in the form of a flip chip 50. In the LED chip 50, a positive terminal 52 and a negative terminal 53 are formed on an insulating substrate 51 made of silicon, and the anode and cathode electrodes of an LED 54 are connected to the positive and negative terminals 52 and 53, respectively. In this case, the bottom of the insulating substrate 51 is preferably non-conductive.

Referring to FIG. 5b, a plurality of LED chips 50-1, 50-2 and 50-3 according to the embodiment of the present invention is mounted on a die bonding part 33 along the same line so that the same polar terminals of the LED chips 50-1, 50-2 and 50-3 are oriented in the same direction. The positive terminal of the leftmost 50-1 of the LED chips 50-1, 50-2 and 50-3 is electrically connected to the die bonding part 33 by a wire, and the negative terminal of the leftmost LED chip 50-1 is electrically connected to the positive terminal of the center LED chip 50-2 by a wire. The negative terminal of the center LED chip 50-2 is connected to the positive terminal of the rightmost LED chip 50-3, and the negative terminal of the rightmost LED chip 50-3 is connected to a wire bonding part 34 by a wire. With this configuration, a series connection can be implemented between a plurality of LEDs in the LED package according to the embodiment of the present invention. However, the above-described arrangement of the positive and negative terminals is only an example, and the polarity of the terminals can be changed to the opposite polarity.

Figure 6A:
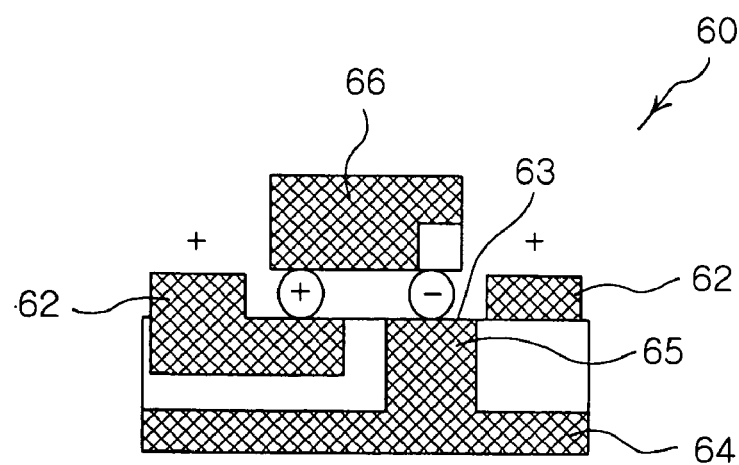
FIGS. 6a and 6b are diagrams showing an LED package in which a plurality of LEDs is arranged in parallel in accordance with another embodiment of the present invention.
Figure 6A:
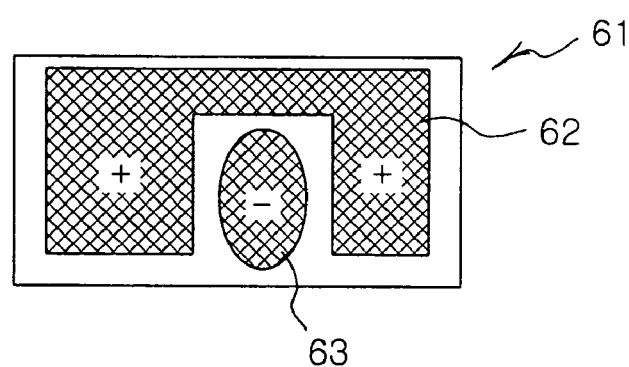
Figure 6B:
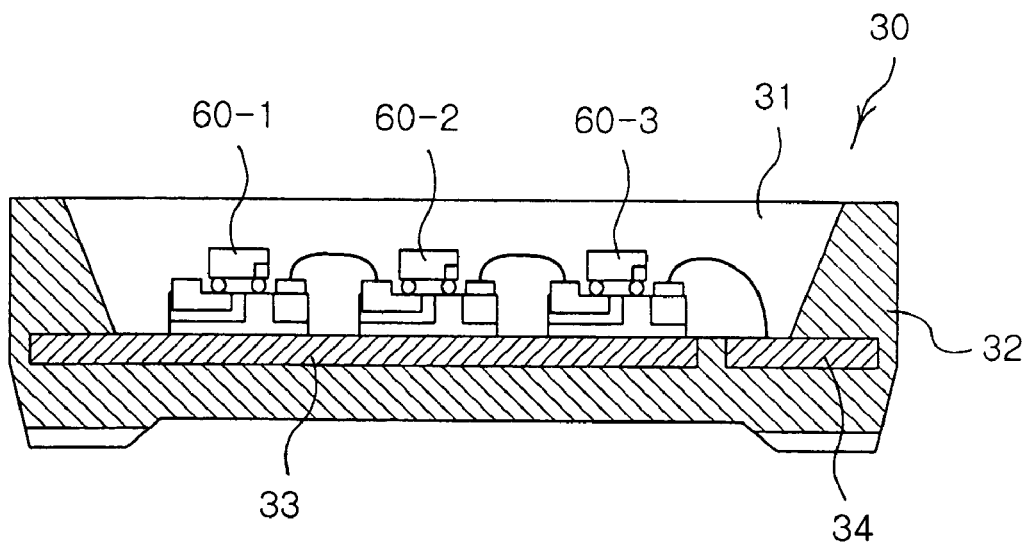

FIGS. 6a and 6b are diagrams showing an LED package in which a plurality of LEDs is arranged in parallel in accordance with another embodiment of the present invention.

Referring to FIG. 6a, each of the LED chips 60, which are used when the plurality of LEDs is arranged in parallel in accordance with the embodiment of the present invention, is constructed as follows. In the LED chip 60, a positive terminal 62 and a negative terminal 63 are formed on the top of an insulating substrate 61 and another negative terminal 64 is formed on the bottom of the insulating substrate 61. The negative terminals 63 and 64 formed on the top and bottom of the insulating substrate 61, respectively, are electrically connected to each other through a via 65.

Referring to FIG. 6b, a plurality of LED chips 60-1, 60-2 and 60-3 according to the embodiment of the present invention is attached to the die bonding part 33 using a conductive bonding material while being aligned substantially along the same line. The positive terminals 62 of the LED chips 60-1, 60-2 and 60-3 are connected to each other by wires and the positive terminal 62 of the leftmost LED chip 60-1 is connected to a wire bonding part 34, so that the LED chips 60-1, 60-2 and 60-3 are connected to an external circuit through the wire bonding part 34. Furthermore, the negative terminals 64 formed on the bottoms of the LED chips 60-1, 60-2 and 60-3 are connected to the external circuit through a die bonding part 33, and connected to the external circuit through the die bonding part 33, so that the LED chips 60-1, 60-2 and 60-3 can be operated. With this construction, a parallel connection can be implemented between a plurality of LEDs in the LED package according to the embodiment of the present invention.

However, the above-described arrangement of the positive and negative terminals is only an example, and the polarity of the terminals can be changed to the opposite polarity.

Figure 7:
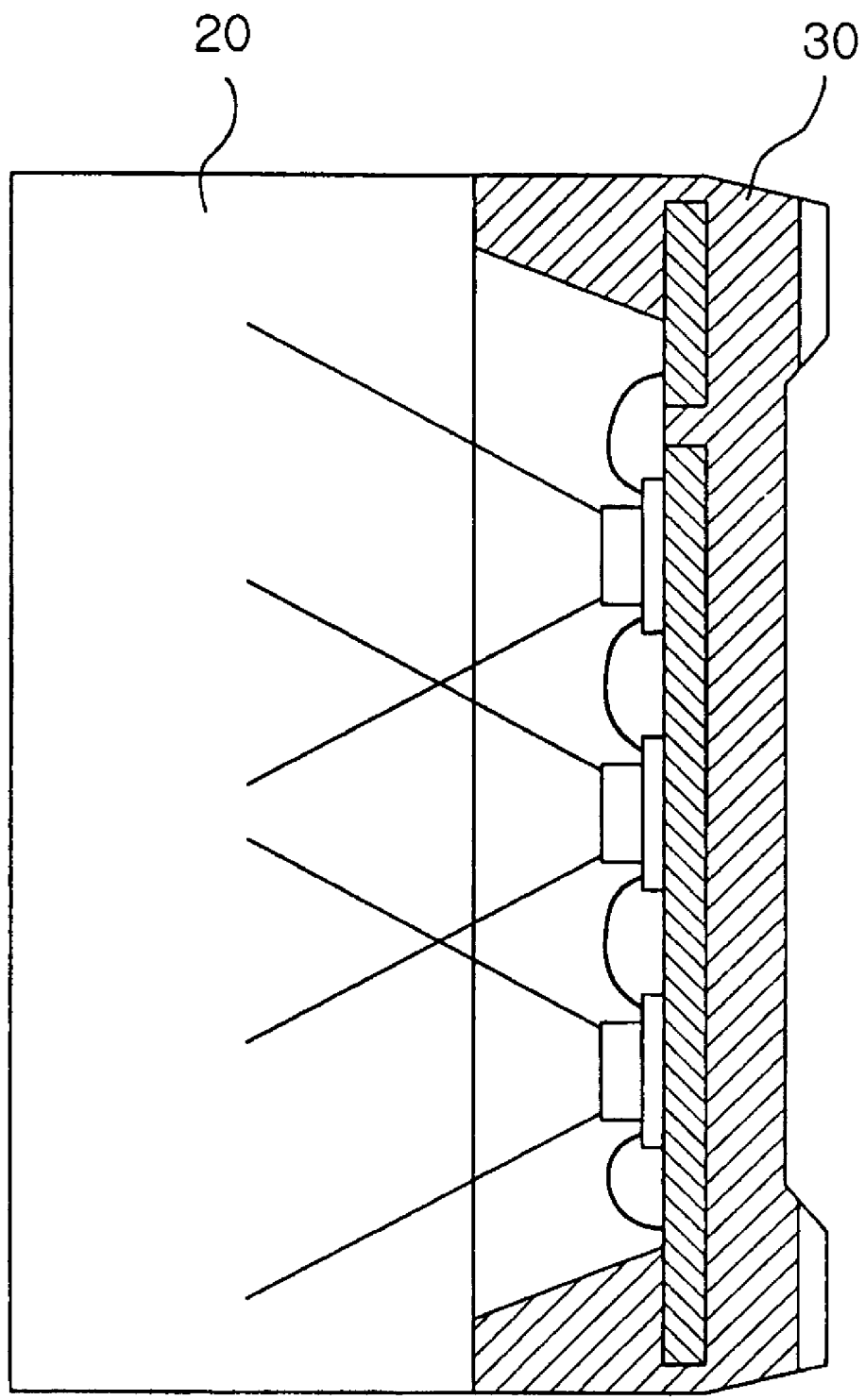
FIG. 7 is a diagram showing a structure in which the LED package for a backlight unit according to the present invention is applied to an LCD, and the effects of the structure.

FIG. 7 is a diagram showing a structure in which the LED package for a backlight unit according to the present invention is applied to an LCD, and the effects of the structure.

Figure 2:
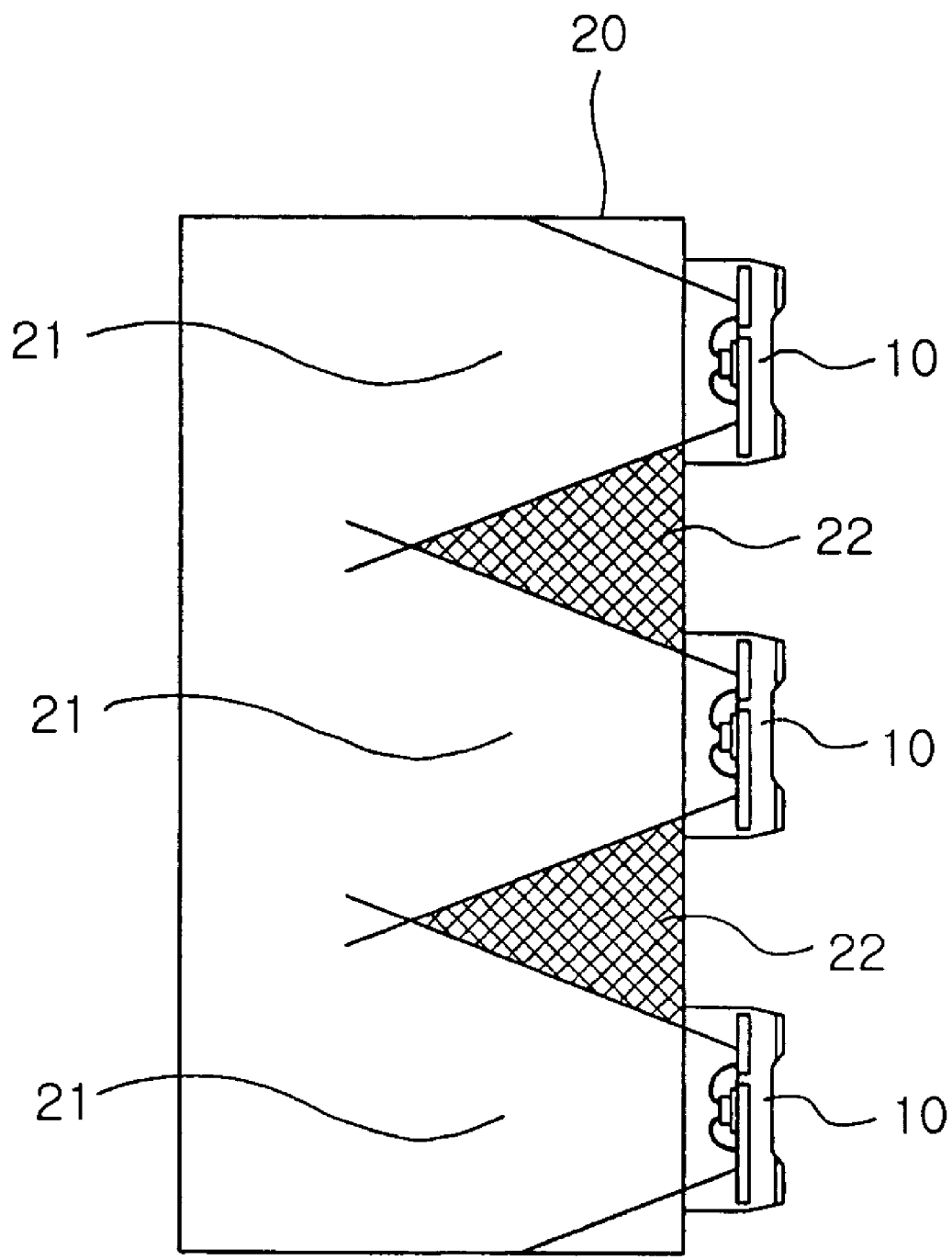
FIG. 2 is a diagram showing a structure in which the conventional LED package for a backlight unit is applied to an LCD, and the effects of the structure.

Referring to FIG. 7, when the LED package 30 according to the embodiment of the present invention is used on a side of the LCD 20, a stain phenomenon does not occur on the LCD 20 and the LCD 20 can be uniformly illuminated, differently from the case of using the conventional LED package 10 shown in FIG. 2. In this case, a wavelength band with which the LED package 30 deals preferably ranges from 300 nm to 700 nm. Furthermore, white series color tones are preferably limited to a region of X: 0.1~4.5 and Y: 0.1~4.5 on a color coordinate system.

Figure 8:
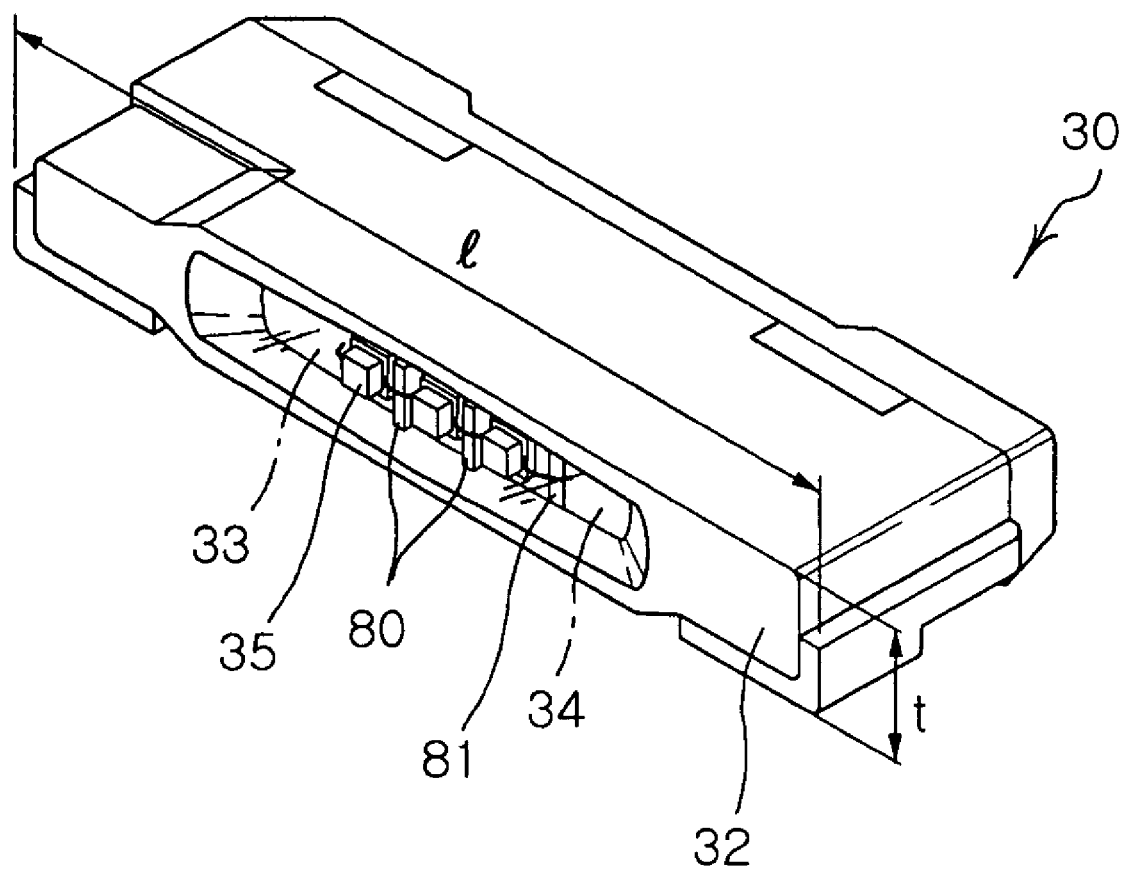
FIG. 8 is a diagram showing an LED package equipped with supports in accordance with another embodiment of the present invention.

FIG. 8 is a diagram showing an LED package equipped with supports in accordance with another embodiment of the present invention.

The LED package 30 according to the present invention is thin in thickness t, and is considerably long in length l, compared to the thickness t thereof. The casing of the LED package 30 can be formed into a single body through injection. Accordingly, the casing of the LED package 30 may be twisted or broken due to variation in temperature or an external impact.

In the present embodiment of the present invention, supports 80, as shown in FIG. 8, are provided to traverse the length of the LED package 30. The supports 80 may be formed at the time of forming the casing of the LED package 30. Alternatively, the supports 80 may be formed separately from the casing of the LED package 30, and attached to the casing of the LED package 30 after the casing of the LED package 30 is formed. The number of supports 80 has no relation to the number of LEDs 35 included in the LED package 30. An insulating part 81 formed between a die bonding part 33 and a wire bonding part 34 may perform a function similar to that of the supports 80. Preferably, at least one support is provided.

The present invention described above is advantageous in that a stain phenomenon, which occurs due to the non-uniform incidence of light on an LCD when the conventional LED package is employed, can be eliminated, so that a high quality screen can be provided.

Furthermore, an LED package for a backlight unit, which not only uses many LEDs but also has a thin and long shape, can be implemented, so that miniaturization and design freedom for a portable terminal or the like equipped with the LED package of the present invention can be achieved.

Furthermore, when the casing of the LED package is formed in a thin and long shape, physical deformation of the casing, such as twisting or breakage, which may occurs due to variation in temperature or an external impact, can be prevented.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A Light Emitting Diode (LED) package for a backlight unit, comprising:
    a plurality of LEDs;
    a plurality of silicon substrates each of which has first and second electrode terminals formed on a top thereof, wherein each of the LEDs is mounted on the first and second electrode terminals;
    a die bonding part on which the plurality of silicon substrates is arranged, and which allows the first electrode of at least one silicon substrate to be electrically connected to an external circuit;
    a wire bonding part which is spaced from the die bonding part and which allows the second electrode of at least one silicon substrate to be electrically connected to the external circuit so that the LEDs are operated; and
    a body having a molding cup which is used to fill a space above the LEDs with transparent resin and a base on which the die bonding part and the wire bonding part are arranged
    wherein the plurality of LED is arranged in series in such a way that the opposite polar electrode terminals of the silicon substrates are connected to each other by wire, one of the first electrodes terminals are connected to the die bonding part, and one of the second electrodes terminals are connected to the wire bonding part.

2. The LED package for a backlight unit as set forth in claim 1, wherein the plurality of LEDs is aligned along a same line.

3. The LED package for a backlight unit as set forth in claim 1, wherein the molding cup and the base are formed as a single body.

4. The LED package for a backlight unit as set forth in claim 1, further comprising at least one support that is formed to traverse a length of the LED package and prevents deformation of the LED package.

5. A Light Emitting Diode(LED) package for a backlight unit, comprising:
    a plurality of LEDs;
    a plurality of silicon substrates, each of which has a first electrode terminal formed on a top thereof, and second electrode terminals formed on the top and a bottom thereof, respectively, and connected to each other through a via, wherein each of the LEDs is mounted on the first and second electrode terminals;
    a die bonding part on which the plurality of silicon substrates is arranged, and which allows the second electrode of at least the one silicon substrate to be electrically connected to an external circuit;
    a wire bonding part which is spaced from the die bonding part, and which allows the first electrode of at least the one silicon substrate to be electrically connected to the external circuit so that the LEDs are operated; and
    a body having a molding cup which is used to fill a space above the LEDs with transparent resin and a base on which the die bonding part and the wire bonding are arranged,
    wherein the plurality of LED is arranged in parallel in such a way that one of the first electrode terminals of the silicon substrates is connected to the wire bonding part by wire and the second electrode terminals formed on the bottom of the silicon substrates are attached to the die bonding part by conductive material.

* * * * *